United States Patent [19]

Zinger

[11] Patent Number: 5,407,449
[45] Date of Patent: Apr. 18, 1995

[54] DEVICE FOR TREATING MICRO-CIRCUIT WAFERS

[75] Inventor: Yan Zinger, Dwingeloo, Netherlands

[73] Assignee: ASM International N.V., Netherlands

[21] Appl. No.: 27,687

[22] Filed: Mar. 8, 1993

[30] Foreign Application Priority Data

Mar. 10, 1992 [NL] Netherlands ............ 9200446

[51] Int. Cl.⁶ ............................................. H01L 21/00
[52] U.S. Cl. .................................. 29/25.01; 29/25.02; 414/935
[58] Field of Search ............... 29/25.01, 25.02; 118/719; 414/935, 936, 937, 938, 939, 940, 941, 217, 218, 219, 220

[56] References Cited

U.S. PATENT DOCUMENTS

| | | | |
|---|---|---|---|
| 4,715,764 | 12/1987 | Hutchinson . | |
| 4,917,556 | 4/1990 | Stark et al. ........................... | 414/937 |
| 4,923,584 | 5/1990 | Bramhall, Jr. et al. ............. | 414/939 |
| 4,951,601 | 6/1990 | Maydan et al. ...................... | 414/935 |
| 4,969,790 | 11/1990 | Petz et al. ............................ | 414/217 |
| 4,995,063 | 2/1991 | Enoki et al. .......................... | 414/936 |
| 5,064,337 | 11/1991 | Asakawa et al. . | |
| 5,076,205 | 12/1991 | Vowles et al. ....................... | 118/719 |
| 5,217,501 | 6/1993 | Fuse et al. ............................ | 118/719 |
| 5,259,881 | 11/1993 | Edwards et al. ..................... | 118/719 |

FOREIGN PATENT DOCUMENTS 270991  6/1988  European Pat. Off. .

*Primary Examiner*—Brian E. Hearn
*Assistant Examiner*—Kevin M. Picardat
*Attorney, Agent, or Firm*—Mark Zovko

[57] ABSTRACT

The invention relates to a device for treating micro-circuit wafers, comprising a feed station for cassettes with wafers, at least one treatment station in which wafer carriers and treatment means co-acting therewith are disposed and a transfer station provided with transferring means for removing wafers from the cassettes and placing them in the wafer carriers and, after treatment, removing the wafers from the wafer carriers and replacing them in the cassettes. At least the feed station and the treatment station are embodied as separate connectable units having in cross section an at least partially regular polygonal periphery, wherein these units connect onto other units at the position of the sides of the regular polygonal periphery.

11 Claims, 4 Drawing Sheets

DEVICE FOR TREATING MICRO-CIRCUIT WAFERS

The invention relates to a device for treating micro-circuit wafers, comprising a feed station for cassettes with wafers, at least one treatment station in which wafer carriers and treatment means co-acting therewith are disposed and a transfer station provided with transferring means for removing wafers from the cassettes and placing them in the wafer carriers and, after treatment, removing the wafers from the wafer carriers and re-placing them in the cassettes.

Such a device is known and is used for instance for performing diffusion processes and LPCVD processes on silicon wafers in the production of integrated circuits. The known devices of this type are constructed for a specific treatment or group of treatments and contain for this purpose all the required stations and assist means.

The invention has for its object to provide a device of the present type which can be manufactured efficiently and therefore economically. This objective is achieved with a device according to the invention with the steps as designated in claim 1. Hereby the device can be formed in a specific assembly by mutually connectable units. A particular station can connect onto a number of sides of each unit. It is thus possible to combine for instance one feed station with a number of treatment stations so that a number of different treatments can be performed successively in the device. Because the treatment stations are separate units, any random assembly of treatment stations can take place.

A further favourable development is characterized in claim 2. Hereby the atmosphere inside each connectable unit can be precisely controlled and adapted to the specific requirement.

With the preferred embodiment of claim 3 a very efficient potential of combining units is obtained.

BRIEF DESCRIPTION OF THE DRAWINGS

Further favourable features and steps of the invention will be elucidated in the following description with reference to several embodiments as shown in the figures.

Figure 1:
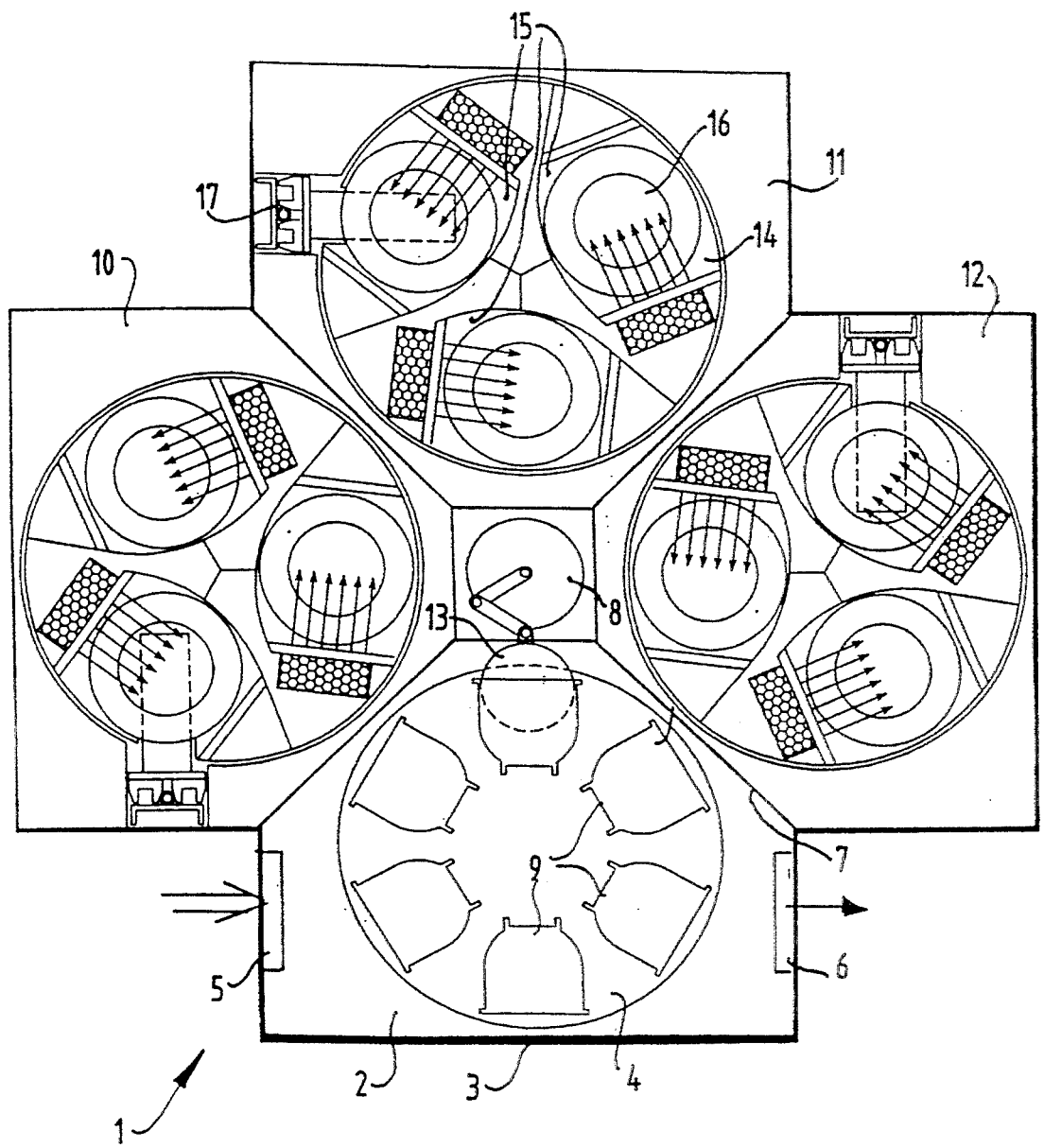
FIG. 1 shows a schematic horizontal cross section of a device according to a first embodiment of the invention.

The device 1 shown in FIG. 1 is intended for treating micro-circuit discs, normally designated with the term wafer. These wafers are subjected to a number of treatment steps in order to form a number of integrated circuits on the surface thereof which are later cut from the wafer and further processed.

Using the device 1 three different, optionally successive treatments can be performed on such wafers.

It is usual to transport the wafers in cassettes, a number 9 of which is shown in top view in FIG. 1 in the feed station 2. Feed station 2 comprises a rotary table 4 in which six such cassettes can be placed on each of three levels, so that this table 4 can contain a total of eighteen cassettes.

The feed unit 2 connects for instance with a wall 3 onto a clean room in which an atmosphere is maintained with a very low dust content. Via an entry point 5 the cassettes 9 can be placed in the rotary table 4. The entry point 5 can be connected to a special feed unit (not shown) which comprises a sluice and thus ensures that when the cassettes are inserted no undesired gases, in particular oxygen, enter the interior of device 1.

As the figure clearly shows, the unit 2 has in cross section an at least partially regular polygonal periphery, that is, the three walls on the right in FIG. 1 form part of a regular octagon in cross section. The treatment stations 10, 11 and 12 to be further described hereinafter also have in cross section an at least partially regular polygonal periphery. The units 2, 10, 11 and 12 are embodied as separate units which connect onto other units at the position of the sides, such as side 7 of the regular polygonal periphery.

In the device 1 the central unit is formed by the transfer unit 8 in which is arranged a robot unit to be further described below. This robot unit 8 can take wafers 13 out of cassettes 9 and place them in wafer carriers in the treatment stations 10, 11, 12. After the treatment the robot 8 once again removes the treated wafers from the wafer carrier of the treatment station and places them in a following treatment station or in an empty cassette 9 rotated into position by means of the rotary table 4. The cassettes 9 with treated wafers 13 can be removed from the feed station 2 via the exit 6 which may comprise a separate exit station having for instance a sluice in the same manner as entry point 5.

As will be described in more detail with reference to FIG. 4, each of the treatment stations 10, 11, 12 shown in FIG. 1 is provided according to a preferred embodiment of the invention with a rotary table 14 in which three compartments 15 are defined. Each of these compartments is provided with a wafer carrier 16. The rotary table 14 can be moved and arrested in three rotational positions. In each of these positions one of the wafer carriers is accessible to the robot in the transfer station 8. After loading a wafer carrier 16 into one of the three compartments 15 the rotary table 14 is moved clockwise a third of a turn. The just filled wafer carrier is herein positioned above a lifting device 17 and below an oven. By means of lifting device 17 the filled wafer carrier is raised into the oven where a heat treatment of the wafers takes place. When the treatment is completed the wafer carrier is once again moved downward into the table 14 which is then moved another third of a turn. Meanwhile the following wafer carrier 16 is filled again and can be placed into the oven using the lifting device 17. The just treated wafers can cool for a time. After a treatment cycle has once again been ended, the rotary table is again rotated through a third of a turn and the wafer carrier 16 with treated and cooled wafers is back in the starting position adjoining the transfer station 8. The treated wafers are then taken out of the wafer carrier and placed for instance in the ready-standing wafer carrier of treatment station 11 or in the ready-standing cassettes 9. The operation for the treatment stations 11 and 12 is in this case identical.

As can be seen clearly in FIG. 1, the units 10, 11 and 12 are substantially identical. The total unit 1 is thus assembled from a number of smaller units which can be manufactured separately.

For other applications the feed station 2 can be combined with two or only one of the treatment units 10, 11 or 12. Other treatment stations can of course be employed instead of the treatment units 10, 11, 12. As a result of the embodiment as separate connectable units having in cross section an at least partially regular polygonal periphery wherein the units connect onto other units at the position of the side of the regular polygonal periphery, a large degree of freedom of construction of a device is possible in accordance with the desired treatments.

As further shown in FIG. 1, the transfer unit 8 is embodied with a square periphery and the feed and treatment stations 2, 10, 11 and 12 each have a partially regular octagonal periphery with angles of 135° and with a side of a length equal to that of the transfer station 8. Hereby four units can be connected in combination with one transfer unit 8.

Figure 2:
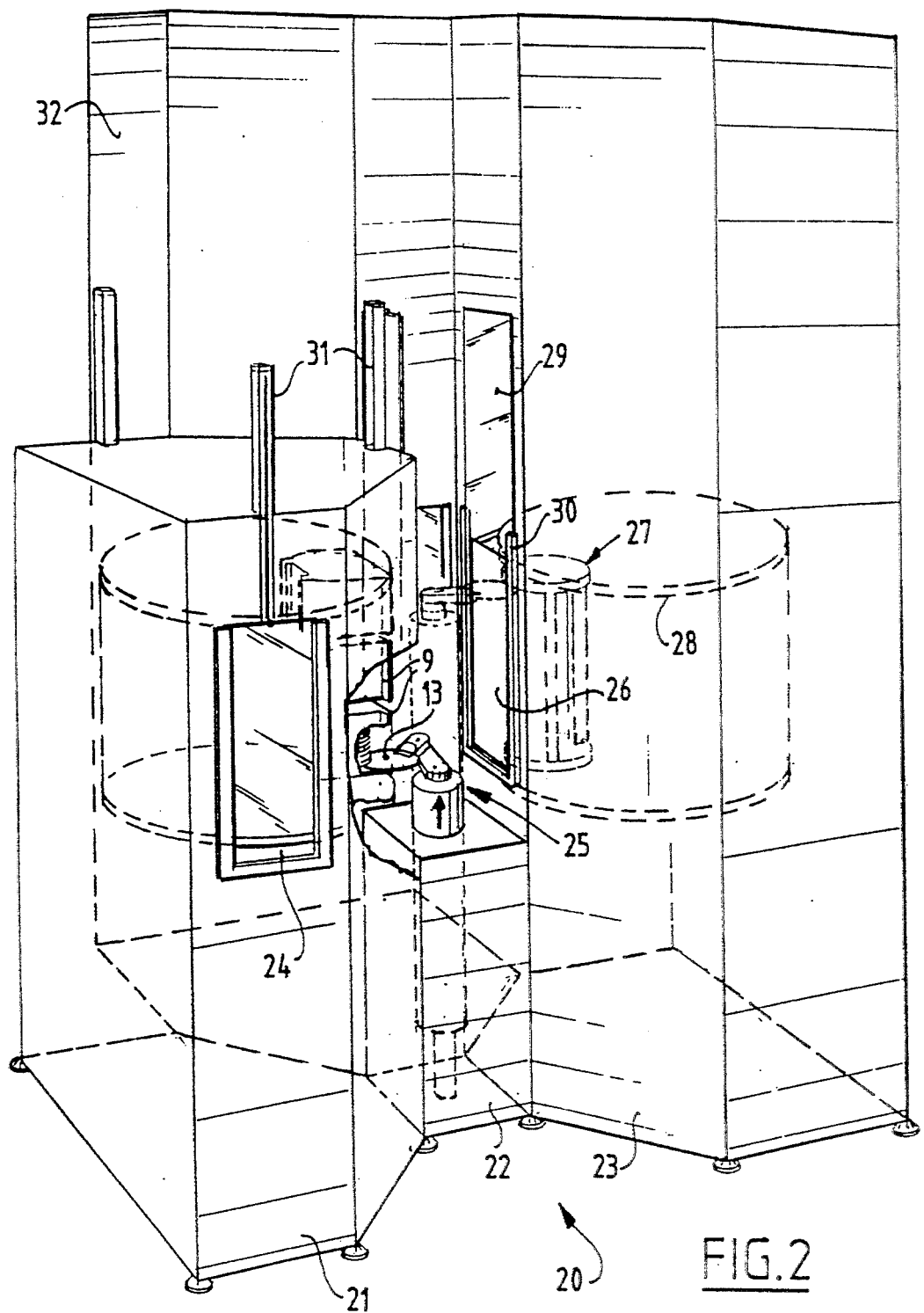
FIG. 2 is a partly broken away and schematic perspective view of a device according to another embodiment of the invention.

However, due to the construction according to the invention another assembly is also possible. FIG. 2 shows for instance a device consisting of one feed unit 21 corresponding to that shown in section in FIG. 1 and two treatment units 23, 32, each of which may correspond to the treatment units 10, 11 and 12. Here also a transfer station 22 is arranged. This transfer unit comprises, as described above, a robot 25 which can take the wafers 13 out of the cassettes 9 and place them in the wafer carrier 27 of the treatment stations and vice-versa. Robot 25 can be a per se known robot and is mounted on a lifting device so that the operational arm thereof can bridge the height difference between the bottom wafer in the lower cassette and the top wafer in the upper cassette 9. It is otherwise usual that the displacement of the wafers takes place successively from the lowest to the uppermost position, that is, the wafers 13 are taken out of the cassettes 9 or wafer carriers 27 beginning with the bottom one and continuing to the topmost, while these are re-placed once again in the wafer carrier or the cassettes beginning with the topmost and continuing thus to the bottom. This prevents possible dust particles falling onto the underlying wafers.

As is shown clearly in FIG. 2, each connectable unit has in this embodiment a closed casing with closable passage openings in at least one of the sides in the part with the regular polygonal periphery. In this embodiment the treatment stations 23, 32 each have one passage opening 26. The feed station 21 is provided with three passage openings 24. The passage openings can be opened and closed using a hatch 29 which is received in guides 30 and which can be moved up and downward by means of a pneumatic cylinder 31. An inflatable seal is preferably incorporated in the guiding 30. In the closed situation of the hatch 29 this seal is inflated and a closely adhering seal contact is thus obtained. When the hatch 29 has to be moved the inflatable seal is made pressureless so that it removes itself from hatch 29. As a result, when the hatch 29 is opened there is no or only minimal slide contact so that the danger of formation of loose dust particles, which is particularly undesirable in the environment of a device according to the invention, is very small.

Also designated schematically in FIG. 2 is the wafer carrier 27 received in the rotary table 28.

Figure 3:
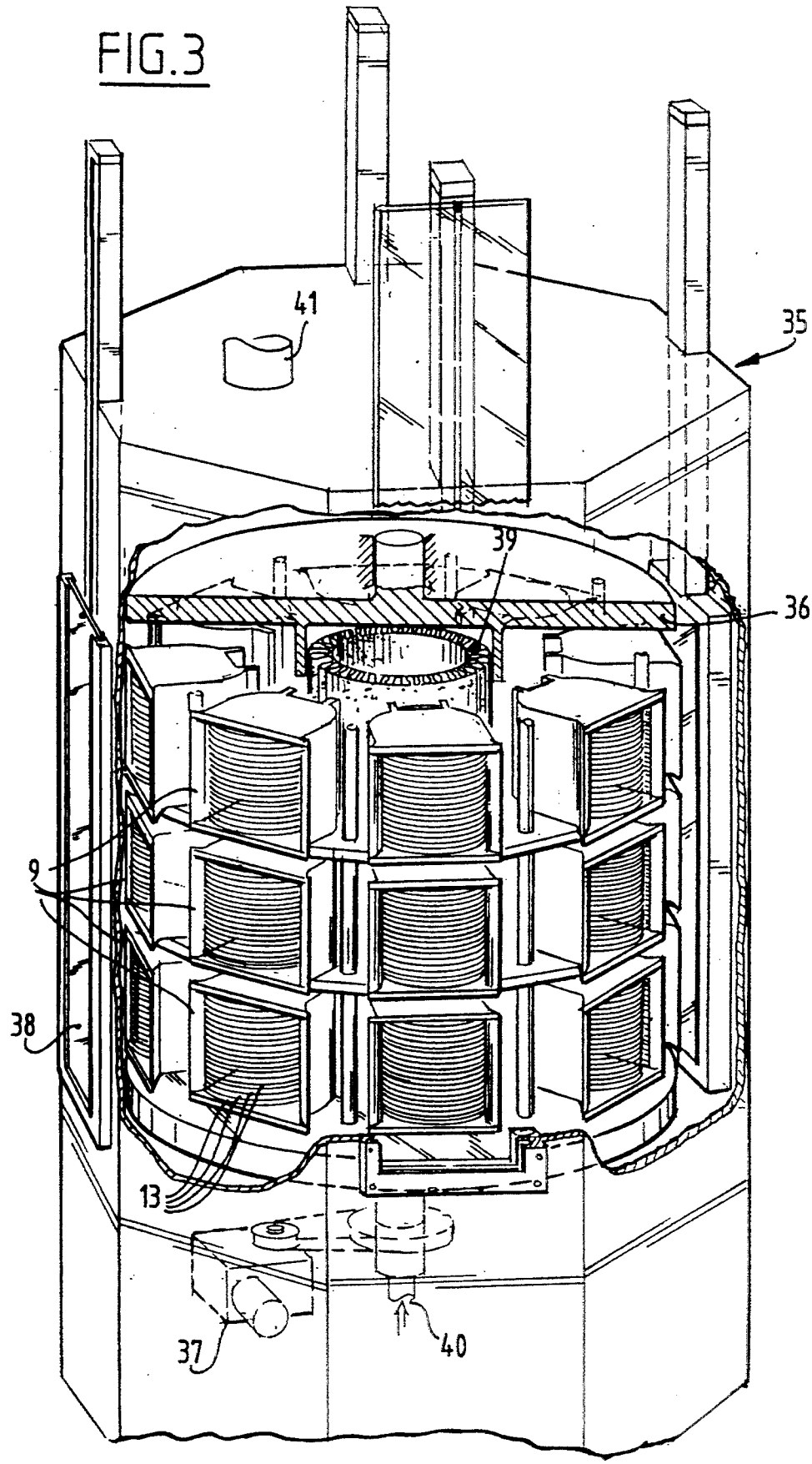
FIG. 3 is a partly broken away perspective view of a feed station according to the invention.

FIG. 3 shows another embodiment of a connectable unit for a device according to the invention. This unit 35 has in cross section a wholly regular octagonal form with equal sides. Unit 35 is provided with four passage openings 38 similar to the passage openings 24 of the unit 21 as shown in FIG. 2. Unit 35 could even be provided with eight passage openings so that it can be coupled on all sides to co-acting units. A maximum flexibility is hereby achieved in the assembly of units to a desired device according to the invention.

The unit 35 also comprises a rotary table 36 in which eight cassettes 9 for wafers 13 can be placed on each of three levels. The table 36 can be driven in rotation and fixed in different rotational positions using a drive device 37 accommodated in a closed compartment of the device 35.

The unit 35 is provided with its own gas circulation device. This comprises a central gas feed via the shaft 40 of the rotary table which leads to the inner space of a centrally disposed cylindrical filter 39. The gas supplied via shaft 40 flows in horizontal radial direction through this filter 39 in a laminar flow through the cassettes 9. Close to the outer periphery the gas flows upward and is discharged via an outlet 41 arranged in the upper portion of the device 35. Due to the thus realized central feed of the gas, all sides of the device 35 are possibly available for connection with other units. The gas circulation is, as is known, necessary for maintaining a very low dust particle level in the device.

Figure 4:
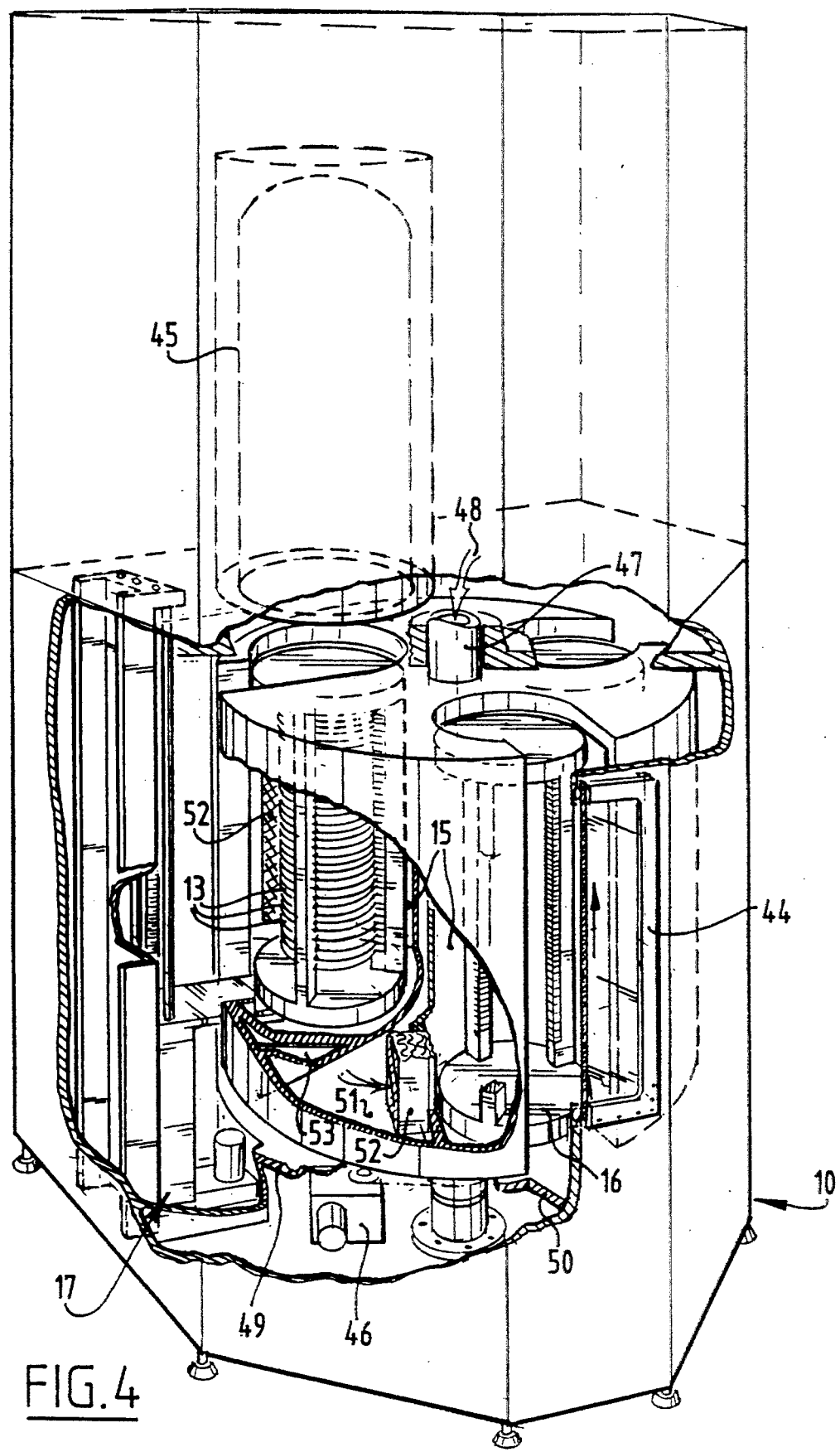
FIG. 4 is a partly broken away perspective view of a treatment station according to the invention.

Shown in FIG. 4 is the already described unit 10 with the treatment station for the wafers 13. The passage opening 44 gives access to a wafer carrier 16 positioned in front of this opening. As described above, the filled wafer carrier is lifted using the lifting device 17 into the oven 45 to undergo a heat treatment therein. The rotary table 14 is rotatably mounted in the unit 10 and can be positioned in three desired rotational positions by means of a drive device 46.

The unit 10 is also provided with its own gas circulation device. The gas is supplied at 48 via a central shaft 47. The gas therein enters a central space between the three compartments 15 which each contain a wafer carrier 16. A partition wall of each compartment 15 with this central space 51 is provided with a filter element 52. The supplied gas flows via this filter element 52 into the compartments 15 and in laminar flow between the wafers received in the wafer carrier. On the side of each compartment 15 lying opposite filter 52 an opening 53 is formed close to the periphery of rotary table 14, which opening corresponds with openings 50 in the bottom 49 of the space in which the rotary table 14 is disposed. Gas blown between the wafers 13 is discharged via these openings to the space below the rotary table 14. From this space it is carried back again using a fan to the gas feed 48 via the shaft 47. In the situation in which undesired gas must be flushed out of the inside space of the device, for instance when oxygen must be displaced therefrom by nitrogen, pure nitrogen will be supplied at 48 and the gas mixture discharged via discharge openings 53, 50 removed from the device until the level of the undesired gas has decreased to a sufficiently low value. From that moment recirculation can be set so that the discharge via a fan unit is connected to the feed 48.

The device can be assembled from different connected units. Although in the foregoing description a vertical oven unit is described in detail as treatment station, the invention is of course not limited to a device with oven units as treatment stations. Other treatment stations may also be embodied in the described manner and combined in a device according to the invention.

I claim:

1. Device for treating micro-circuit wafers, comprising a feed station for cassettes with wavers, at least one treatment station in which wafer carriers and treatment means co-acting therewith are disposed and a transfer station provided with transferring means for removing wafers from the cassettes and placing them in the wafer carries and, after treatment, removing the wafers from the wafer carriers and placing them in the cassettes, wherein at least the feed station and the treatment station are embodied as separate connectable units, wherein these units connect onto the transfer station and at least one other unit having in cross section an at least partially regular polygonal periphery at the position of the sides of the regular polygonal periphery of these units.

2. Device as claimed in claim 1, wherein each connectable unit has a closed casing having in horizontal cross section an at least partially regular polygonal periphery with a closable passage opening in at least one of the sides of the regular polygonal periphery.

3. Device as claimed in claim 1, wherein the transfer station has a square periphery and the feed and treatment stations each have a partially regular octagonal periphery with angles of 135° and connect onto this transfer station with a side of a length equal to that of the transfer station.

4. Device as claimed in claim 1, wherein each unit is provided with its own gas circulation device.

5. Device as claimed in claim 4, wherein the gas circulation device comprises a central gas diffusing means and gas discharge means close to the periphery and is provided with gas guiding means which can guide the gas in a laminar flow from the gas diffusing means along the wafers to the gas discharge means.

6. Device as claimed in claim 5, wherein the feed station comprises a rotary table for supporting a number of wafer cassettes and the gas guiding means comprise a tubular filter element disposed concentrically of the axis of rotation of the table, wherein the gas diffusing means is connected to the interior of the tubular filter element.

7. Device as claimed in claim 5, wherein at least one of the treatment stations is a thermal treatment station wherein the wafer carriers are arranged on a rotary table and the gas guiding means comprise a filter element disposed parallel to each wafer carrier and adjacent thereto and guide walls for guiding the gas from the central diffusing means to the side of the filter element remote from the wafer carrier.

8. Device as claimed in claim 7, wherein each wafer carrier is disposed in an isolated compartment of the rotary table.

9. Device as claimed in claim 7, wherein the rotary table comprises three wafer carriers, and drive and arresting means are present for moving and arresting the table in three rotational positions, and wherein above a position corresponding to the position of one of the wafer carriers in the rotational positions a tubular oven is arranged and lifting means are present for lifting a wafer carrier into the oven relative to the table.

10. Device as claimed in claim 1, wherein the transfer station comprises a per se known robot unit mounted on a lifting device.

11. The device of claim 1 wherein said treatment station includes a rotary table which can be moved and arrested in three rotational positions, each of said rotational position being located in a defined compartment within said treatment station.

* * * * *